United States Patent
Cheng et al.

(10) Patent No.: US 9,282,668 B2
(45) Date of Patent: Mar. 8, 2016

(54) ELECTRONIC APPARATUS AND METHOD FOR ASSEMBLING THE SAME

(71) Applicant: HTC Corporation, Taoyuan County (TW)

(72) Inventors: Ying-Yen Cheng, Taoyuan County (TW); Yu-Jing Liao, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 239 days.

(21) Appl. No.: 14/080,801

(22) Filed: Nov. 15, 2013

(65) Prior Publication Data

US 2014/0118960 A1    May 1, 2014

Related U.S. Application Data

(63) Continuation-in-part of application No. 13/629,625, filed on Sep. 28, 2012, now Pat. No. 9,137,918.

(51) Int. Cl.
*G06F 1/16* (2006.01)
*H05K 7/06* (2006.01)
*H04N 5/257* (2006.01)
(Continued)

(52) U.S. Cl.
CPC ............. *H05K 7/06* (2013.01); *G06F 1/1626* (2013.01); *G06F 1/1658* (2013.01); *H04M 1/0202* (2013.01); *H04M 1/0262* (2013.01); *H04M 1/0277* (2013.01); *H04N 5/257* (2013.01); *H04M 1/0266* (2013.01)

(58) Field of Classification Search
CPC ............. G06F 1/16; G06F 1/1601–1/1611; G06F 1/1613–1/1698; G06F 1/18–1/189; H05K 5/00–5/069; H05K 7/00–7/186

USPC ............. 361/679.01–679.45, 679.55–679.61, 361/724–727; 455/575.1–575.9; 349/56–60; 312/223.1–223.3
See application file for complete search history.

(56) References Cited

U.S. PATENT DOCUMENTS 6,388,870 B1 *  5/2002   Canova, Jr. ........... G06F 1/1626
                                                          312/223.2
7,336,228 B2    2/2008   Lu et al.
(Continued)

FOREIGN PATENT DOCUMENTS

CN    101416473    4/2009
CN    101080876    7/2012

OTHER PUBLICATIONS

"Notice of Allowance of U.S. Counterpart Application", issued on Jan. 30, 2015, p. 1-p. 11.
(Continued)

*Primary Examiner* — Anthony Haughton
*Assistant Examiner* — Razmeen Gafur
(74) *Attorney, Agent, or Firm* — Jianq Chyun IP Office

(57) ABSTRACT

An electronic apparatus including a housing, a first circuit board, a battery module, a display module and a second circuit board is provided. The housing has at least an opening and an accommodating space. The first circuit board is disposed in the accommodating space. The battery module is disposed in the accommodating space and stacked over the first circuit board. The display module is disposed in the accommodating space and stacked over the battery module, wherein the display module is visible through the opening. The second circuit board is disposed in the accommodating space and disposed under the display module, beside the battery module.

19 Claims, 7 Drawing Sheets

(51) Int. Cl.
*H04M 1/02* (2006.01)
*H05K 5/00* (2006.01)
*H05K 7/00* (2006.01)

(56) References Cited

U.S. PATENT DOCUMENTS

| | | | | |
|---|---|---|---|---|
| 7,983,037 | B2 * | 7/2011 | Zhang | H01M 2/1066 312/223.1 |
| 8,280,463 | B2 | 10/2012 | Hori et al. | |
| 8,390,255 | B1 | 3/2013 | Fathollahi | |
| 8,456,847 | B2 | 6/2013 | Hwang et al. | |
| 8,520,373 | B2 | 8/2013 | Liu | |
| 8,619,422 | B2 | 12/2013 | Lim et al. | |
| 8,629,952 | B2 * | 1/2014 | Sugimori | G02F 1/13452 349/149 |
| 8,634,184 | B2 * | 1/2014 | Kim | G06F 1/1624 361/679.3 |
| 8,634,885 | B2 * | 1/2014 | Chang | H04M 1/0277 361/679.02 |
| 8,654,084 | B2 | 2/2014 | Hong et al. | |
| 8,737,052 | B2 | 5/2014 | Cho et al. | |
| 8,880,129 | B2 * | 11/2014 | Lee | H04M 1/0249 361/679.01 |
| 8,885,333 | B2 * | 11/2014 | Lim | H04M 1/0283 345/204 |
| 8,947,865 | B2 * | 2/2015 | Matsuda | H04M 1/0266 349/58 |
| 2003/0234897 | A1 | 12/2003 | Ozawa | |
| 2004/0204009 | A1 | 10/2004 | Cheng et al. | |
| 2004/0263482 | A1 | 12/2004 | Goertz | |
| 2005/0122669 | A1 | 6/2005 | Lee | |
| 2005/0141186 | A1 | 6/2005 | Shimizu | |
| 2006/0181841 | A1 | 8/2006 | Chen et al. | |
| 2006/0233356 | A1 * | 10/2006 | Lu | H04B 1/3838 379/433.01 |
| 2006/0250762 | A1 | 11/2006 | Yang et al. | |
| 2008/0019502 | A1 * | 1/2008 | Emmert | H04M 1/026 379/433.07 |
| 2008/0176603 | A1 * | 7/2008 | Yu | H04M 1/0208 455/566 |
| 2009/0015565 | A1 * | 1/2009 | Hong | G06F 1/1624 345/173 |
| 2009/0082073 | A1 | 3/2009 | Hori et al. | |
| 2009/0175018 | A1 * | 7/2009 | Zaitsu | H04M 1/185 361/800 |
| 2009/0257189 | A1 * | 10/2009 | Wang | H04M 1/0249 361/679.56 |
| 2009/0316351 | A1 | 12/2009 | Zadesky et al. | |
| 2009/0323292 | A1 | 12/2009 | Hwang et al. | |
| 2010/0091439 | A1 * | 4/2010 | Horii | H04M 1/0249 361/679.01 |
| 2010/0105452 | A1 * | 4/2010 | Shin | H04M 1/0277 455/575.8 |
| 2010/0134961 | A1 | 6/2010 | Huang et al. | |
| 2010/0258626 | A1 * | 10/2010 | Watanabe | H01M 2/1066 235/380 |
| 2010/0273537 | A1 * | 10/2010 | Jiang | H04M 1/0262 455/575.1 |
| 2010/0279694 | A1 | 11/2010 | Yagi et al. | |
| 2011/0021255 | A1 * | 1/2011 | Kim | H01Q 1/242 455/575.1 |
| 2011/0032668 | A1 | 2/2011 | Lee | |
| 2011/0058320 | A1 | 3/2011 | Kim et al. | |
| 2011/0077063 | A1 * | 3/2011 | Yabe | H04M 1/0237 455/575.4 |
| 2011/0164361 | A1 | 7/2011 | Yoon et al. | |
| 2011/0199721 | A1 * | 8/2011 | Allen | H04M 1/0237 361/679.01 |
| 2011/0216485 | A1 | 9/2011 | Kang et al. | |
| 2011/0222219 | A1 | 9/2011 | Bae et al. | |
| 2011/0222260 | A1 | 9/2011 | Goro et al. | |
| 2011/0237314 | A1 * | 9/2011 | Kajiwara | H04M 1/0237 455/575.4 |
| 2011/0261510 | A1 * | 10/2011 | Liu | G06F 1/1637 361/679.01 |
| 2011/0261514 | A1 | 10/2011 | Lee et al. | |
| 2011/0279947 | A1 | 11/2011 | Peng | |
| 2011/0292578 | A1 | 12/2011 | Lim et al. | |
| 2011/0317343 | A1 | 12/2011 | Shin et al. | |
| 2012/0050988 | A1 * | 3/2012 | Rothkopf | H04M 1/0266 361/688 |
| 2012/0111711 | A1 | 5/2012 | Cho et al. | |
| 2012/0115551 | A1 * | 5/2012 | Cho | H04M 1/23 455/566 |

OTHER PUBLICATIONS

"Notice of Allowance of U.S. Counterpart Application", issued on May 8, 2015, p. 1-p. 12.

"Office Action of US parent Application, U.S. Appl. No. 13/629,625," issued on Jun. 4, 2014, p. 1-p. 11.

"Office Action of US parent Application, U.S. Appl. No. 13/629,625," issued on Sep. 24, 2014, p. 1-p. 17.

"Office Action of Taiwan Counterpart Application", issued on Sep. 26, 2014, p. 1-p. 8.

* cited by examiner

ELECTRONIC APPARATUS AND METHOD FOR ASSEMBLING THE SAME

CROSS-REFERENCE TO RELATED APPLICATION

This application is a continuation-in-part application of and claims the priority benefit of a prior application Ser. No. 13/629,625, filed on Sep. 28, 2012, now pending. The entirety of the above-mentioned patent application is hereby incorporated by reference herein and made a part of this specification.

FIELD OF THE INVENTION

The application relates to an electronic apparatus and a method for assembling the same.

DESCRIPTION OF RELATED ART

In recent years, as the technology advances, handheld devices such as mobile phones, tablet computers are more commonly used and are developed to be more convenient, multi-functional and exquisite. More and more choices like the aforementioned are provided for consumers to choose from. Users have higher demands toward the handheld devices day by day. As the time prolongs for users to hold handheld devices by hands, the feeling in holding handheld devices are getting more important.

In order to enhance the feeling in holding handheld devices, a housing surface of handheld electronic devices are often designed to have a curved surface to conform designs of ergonomics. However, according to the current stacking method of interior space of handheld devices, a battery is closer to a housing of a handheld device than a motherboard, and therefore such handheld device cannot present a smooth arc shape due to the battery disposition.

SUMMARY OF THE INVENTION

The application is directed to an electronic apparatus with a smooth and curved surface of a housing.

The application provides an electronic apparatus including a housing, a first circuit board, a battery module, a display module and a second circuit board. The housing has at least an opening and an accommodating space. The first circuit board is disposed in the accommodating space. The battery module is disposed in the accommodating space and stacked over the first circuit board. The display module is disposed in the accommodating space and stacked over the battery module, wherein the display module is visible through the opening. The second circuit board is disposed in the accommodating space and disposed under the display module, beside the battery module.

In light of the foregoing, in the application, an appearance of a housing of an electronic apparatus can be presented as a smooth and curved surface to effectively utilize a space inside the housing and increase a capacity of a battery module. In addition, the method for assembling an electronic apparatus can assemble components inside a housing to effectively utilize a space inside the housing and increase a capacity of a battery module.

In order to make the aforementioned features and advantages of the application more comprehensible, embodiments accompanying figures are described in details below.

DESCRIPTION OF EMBODIMENTS

Figure 1:
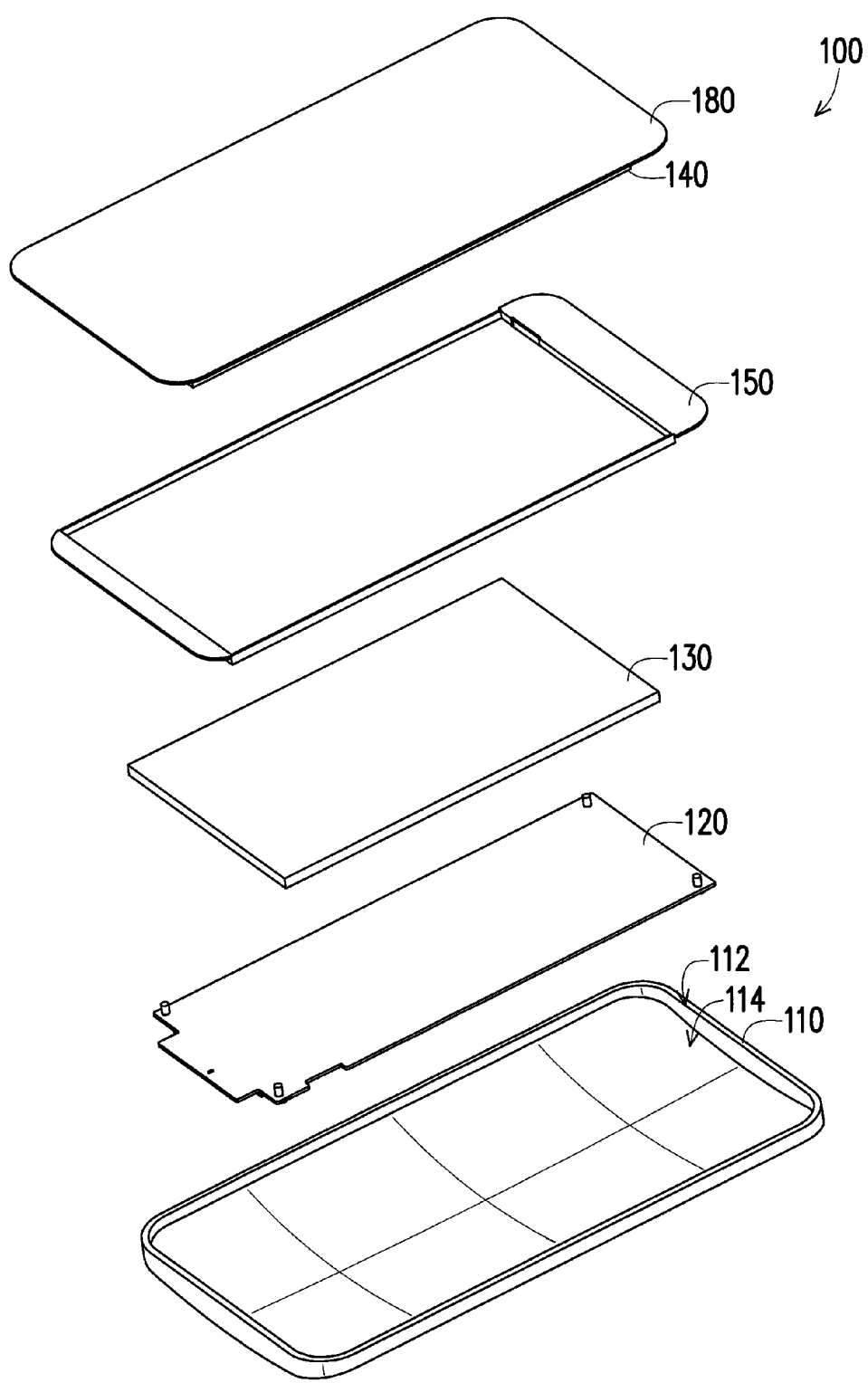
FIG. 1 is an exploded view of an electronic apparatus according to an embodiment of the application.
Figure 2:
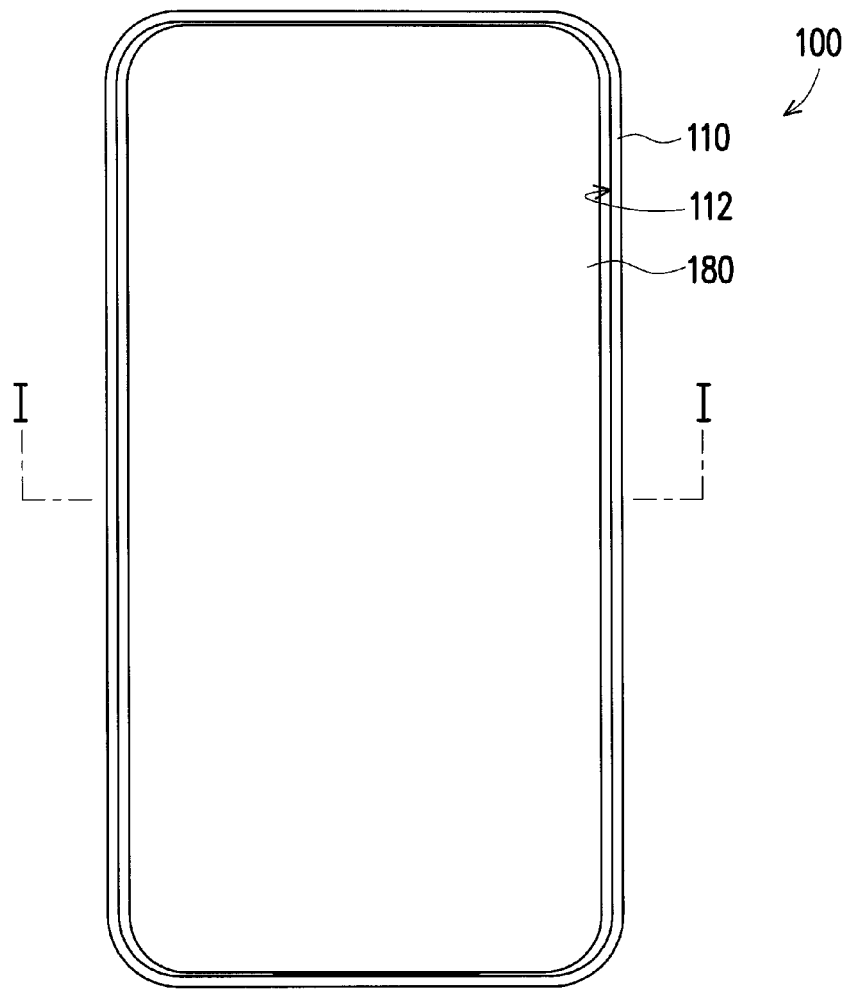
FIG. 2 is a front view of an assembled electronic apparatus of FIG. 1.
Figure 3:
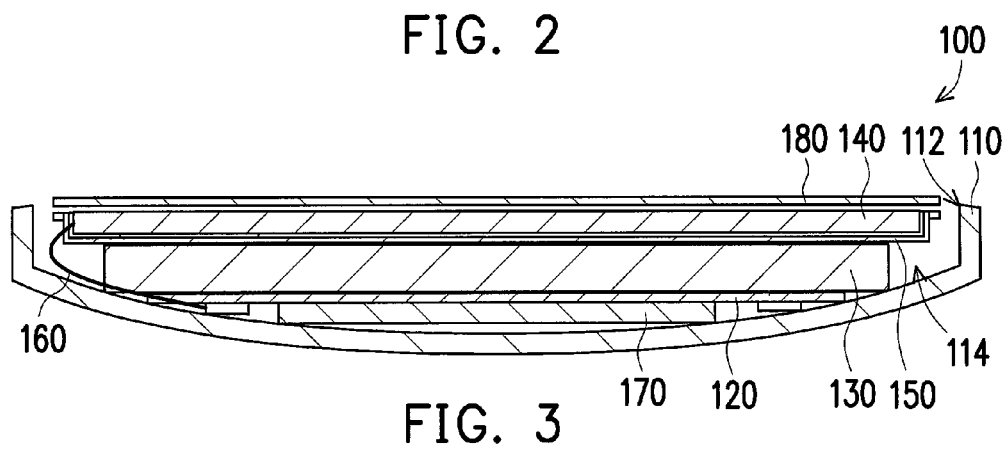
FIG. 3 is an enlarged cross-sectional view of the electronic apparatus along the line I-I of FIG. 2.

FIG. 1 is an exploded view of an electronic apparatus according to an embodiment of the application. FIG. 2 is a front view of an assembled electronic apparatus of FIG. 1. FIG. 3 is an enlarged cross-sectional view of the electronic apparatus along the line I-I of FIG. 2. Referring to FIG. 1 to FIG. 3. In the present embodiment, an electronic apparatus 100 includes a housing 110, a motherboard 120, a battery module 130 and a display module 140.

The housing 110 has at least an opening 112 and an accommodating space 114. The motherboard 120 is disposed in the accommodating space 114, wherein the motherboard 120 includes a rigid circuit board and a plurality of electronic components mounted on the rigid circuit board. The battery module 130 is disposed in the accommodating space 114 and stacked over the motherboard 120. The display module 140 is disposed in the accommodating space 114 and stacked over the battery module 130 and is visible through the opening 112. The display module 140 can have either a plug-in or build-in touch module.

In the present embodiment, a width of the motherboard 120 is narrower than a width of the battery module 130, and the width of the battery module 130 is narrower that a width of the display module 140. Accordingly, an appearance of the housing 110 can be presented as a smooth arc shape. Meanwhile, the width of the battery module 130 is widened when the battery module 130 is moved to a location between the motherboard 120 and the display module 140. As a result, with the same length and thickness, the width of the battery module 130 is widened to increase a capacity of the battery module 130.

It should be noted that any width of any member disclosed in the application is a width in a horizontal direction of the member illustrated in FIG. 2 or FIG. 3.

Figure 4:
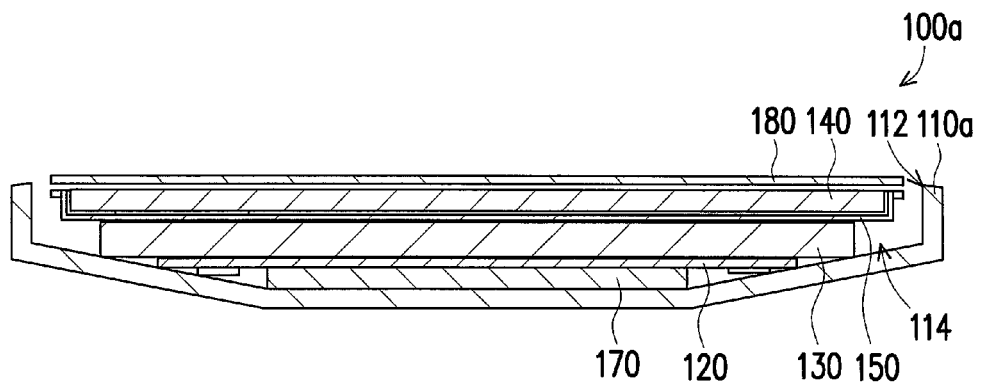
FIG. 4 is an enlarged cross-sectional view of an electronic apparatus according to another embodiment of the application.

Referring to FIG. 3 again. In the present embodiment, the housing 110 can extend along a curved surface, and edges of the motherboard 120 and edges of the battery module 130 lean against the housing 110. In another embodiment illustrating an electronic apparatus 100a, as shown in FIG. 4, a housing 110a can extend along an inclined plane.

Referring to FIG. 1 and FIG. 3 again. In the present embodiment, the electronic apparatus 100 further includes a frame 150 wherein the frame 150 is disposed in the accommodating space 114 to secure a relative position between the battery module 130 and the display module 140.

Referring to FIG. 3 again. In the present embodiment, the electronic apparatus 100 further includes a flexible printed circuit board 160 that connects the motherboard 120 and the display module 140. Specifically, the flexible printed circuit board 160 bypasses the battery module 130 and connects the motherboard 120 and the display module 140.

Referring to FIG. 3 again. In the present embodiment, the electronic apparatus 100 further includes a shield member 170 disposed in the accommodating space 114, wherein the shield member 170 is located under the motherboard 120, and a width of the shield member 170 is narrower than the width of the motherboard 120.

Referring to FIG. 1 and FIG. 3 again. In the present embodiment, the electronic apparatus 100 further includes a cover plate 180 disposed at the opening 112 of the housing 110, such that the display module 140 is located between the battery module 130 and the cover plate 180. The width of the display module 140 is narrower than a width of the cover plate 180.

Figure 5:
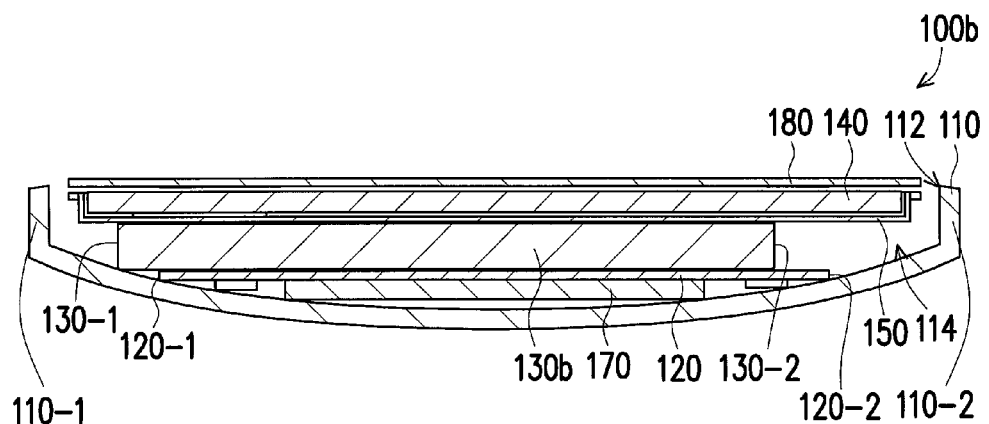
FIG. 5 is an enlarged cross-sectional view of an electronic apparatus according to yet another embodiment of the application.

FIG. 5 is an enlarged cross-sectional view of an electronic apparatus according to yet another embodiment of the application. Referring to FIG. 5. According to an electronic apparatus 100b of the present embodiment, one edge 130-1 of a battery module 130b in a width direction of the battery module 130b is closer to a corresponding side 110-1 of the housing 110 than a corresponding edge 120-1 of the motherboard 120 in a width direction of the motherboard 120. In addition, one edge 130-2 of the battery module 130b in a width direction of the battery module 130b is not closer to a corresponding side 110-2 of the housing 110 than a corresponding edge 120-2 of the motherboard 120 in a width direction of the motherboard 120. As a result, according to embodiments of FIG. 3 and FIG. 5, at least one edge of the battery module in a width direction of the battery module is closer to a corresponding side of the housing than a corresponding edge of the motherboard in a width direction of the motherboard.

Figure 6:
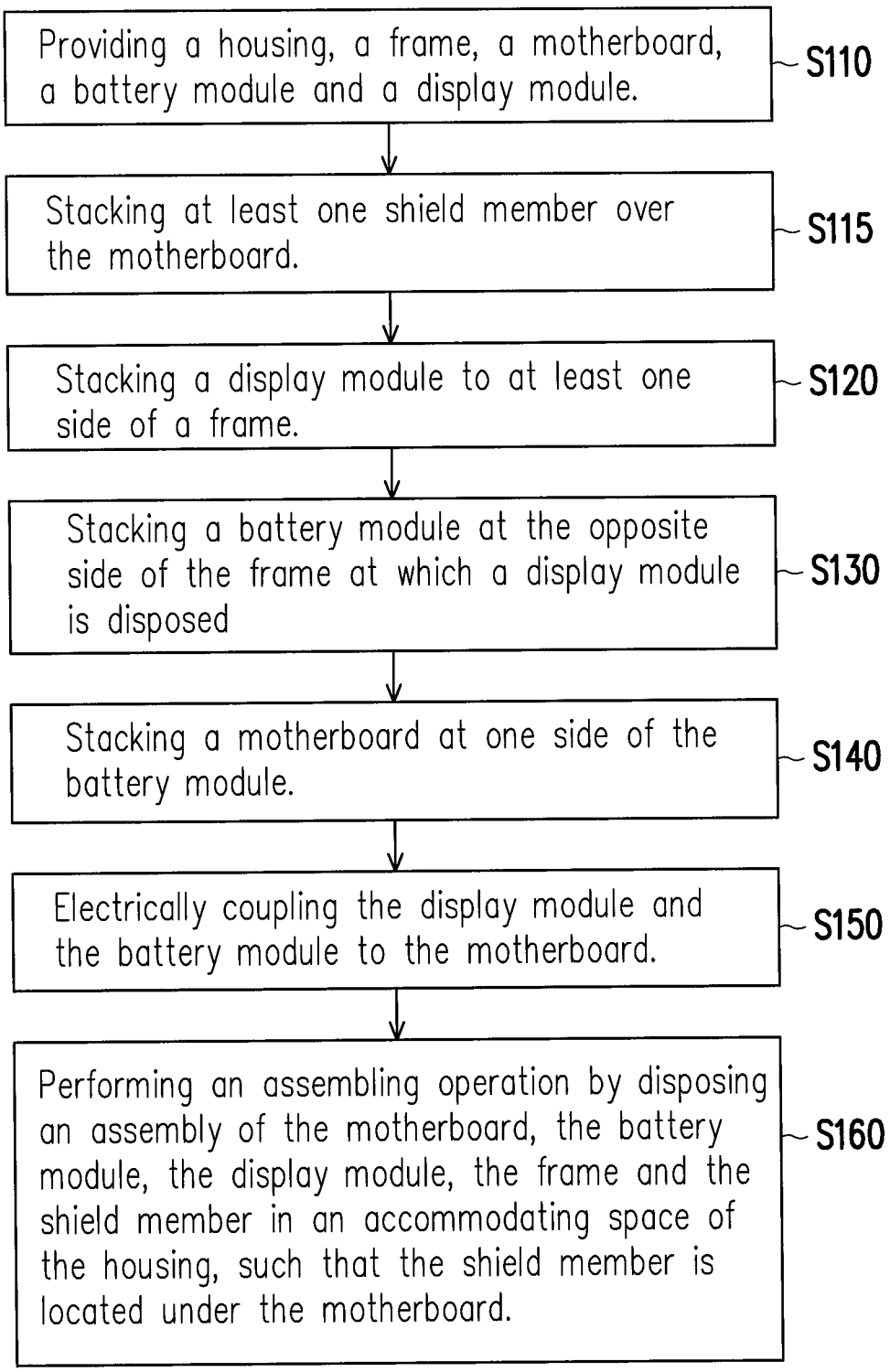
FIG. 6 is a flow chart of a method for assembling an electronic apparatus according to an embodiment of the application.

FIG. 6 is a flow chart of a method for assembling an electronic apparatus according to an embodiment of the application. Referring to FIG. 1 and FIG. 6. In Step S110, the housing 110, the motherboard 120, the battery module 130, the display module 140 and the frame 150 are provided, wherein the housing 110 has the opening 112 and the accommodating space 114, the width of the motherboard 120 is narrower than the width of the battery module 130, and the width of battery module 130 is narrower than the width of the display module 140. In Step S120, the display module 140 is stacked at one side of the frame 150.

In Step S130, the battery module 130 is stacked at the opposite side of the frame 150 at which the display module 140 is disposed. In Step S140, the motherboard 120 is stacked at one side of the battery module 130. In Step S150, the display module 140 and the battery module 130 are electrically coupled to the motherboard 120. In Step S160, an assembling operation is performed, wherein an assembly of the motherboard 120, the battery module 130, the display module 140 and the frame 150 are disposed in the accommodating space 114 of the housing 110.

Referring to FIG. 3 and FIG. 6. The present embodiment further includes Step S115. In Step S115, before performing the assembling operation (Step S160), the shield member 170 is located under the motherboard 120, wherein the width of the shield member 170 is narrower than the width of the motherboard 120. After the assembling operation (Step S160) is performed, the shield member 170 is also disposed in the accommodating space 114 and located under the motherboard 120.

Referring to FIG. 3 and FIG. 6. In the present embodiment, a step of electrically coupling the display module 140 to the motherboard 120 in Step S150 includes having the flexible printed circuit board 160 bypassing the battery module 130 and connecting the display module 140 and the motherboard 120.

Furthermore, another circuit board carrying a vibrator or a camera module can be assembled together but still keeping the smooth curving shape of the housing. For easy description, the motherboard can also be referred as a first circuit board, and the circuit board carrying a vibrator or a camera module can be referred as a second circuit board.

Figure 7:
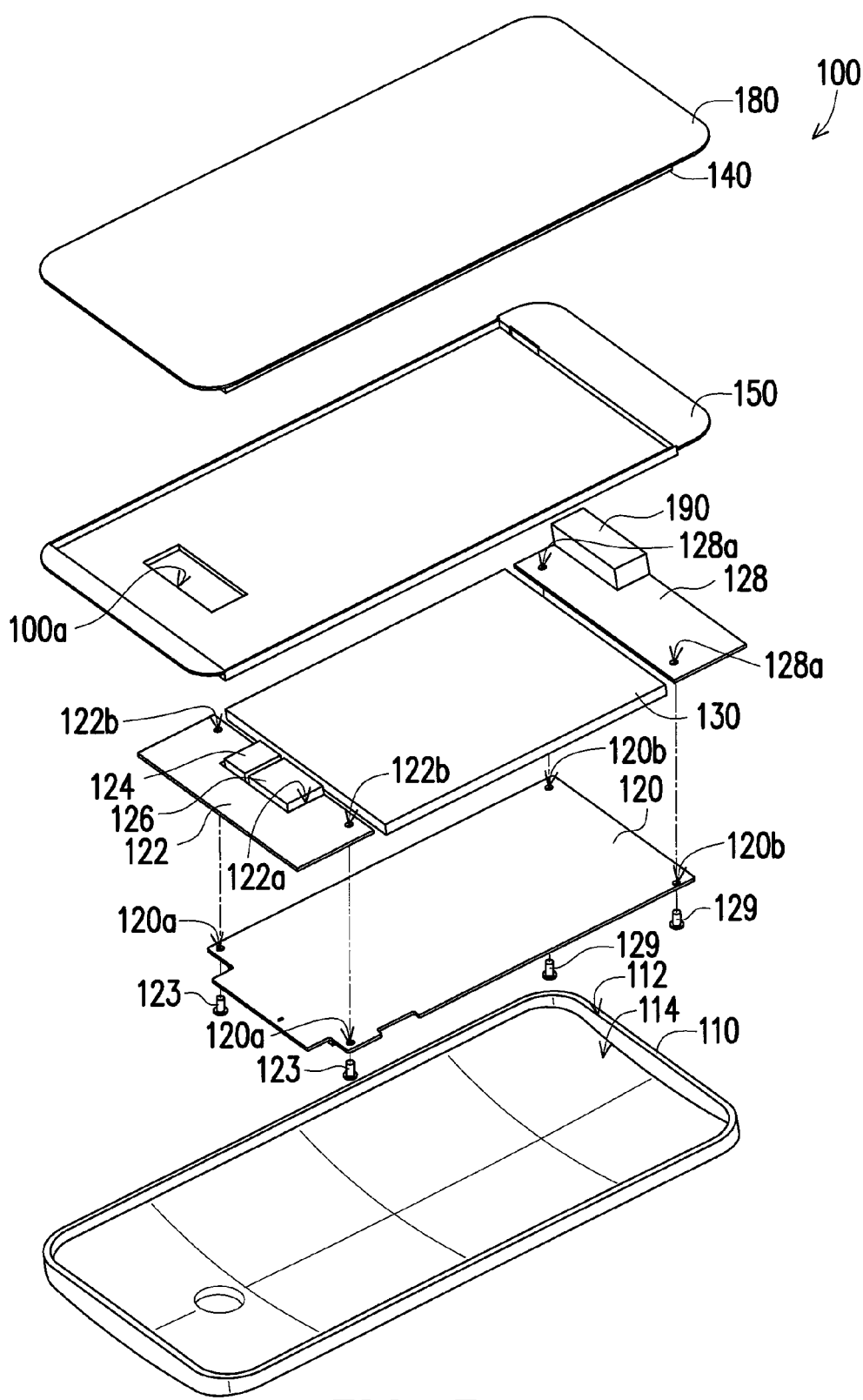
FIG. 7 is an exploded view of an electronic apparatus according to another embodiment of the application.
Figure 8:
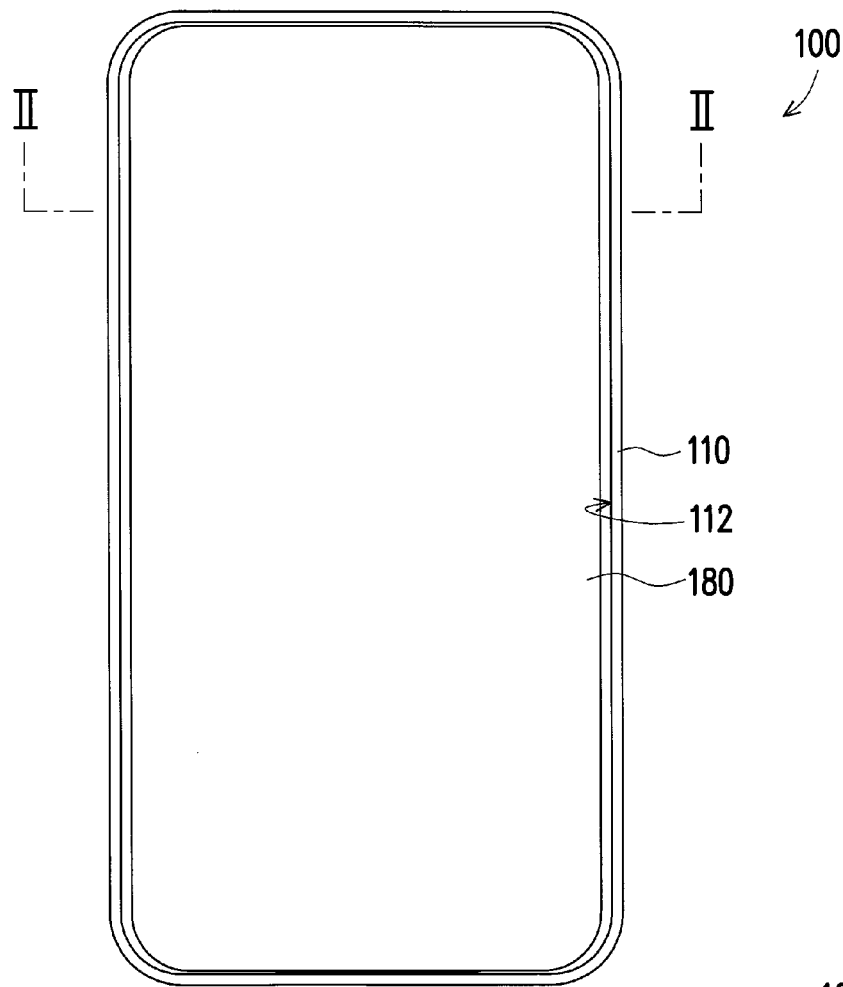
FIG. 8 is a front view of an assembled electronic apparatus of FIG. 7.
Figure 9:
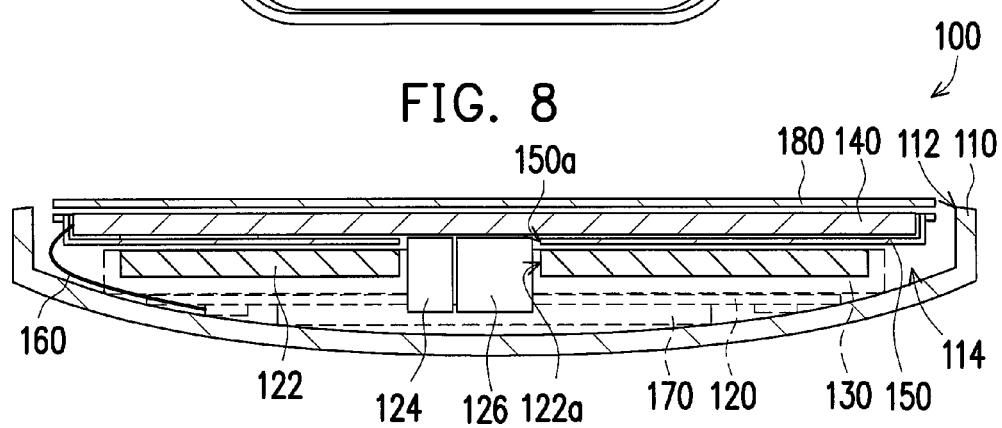
FIG. 9 is an enlarged cross-sectional view of the electronic apparatus along the line II-II of FIG. 8.

FIG. 7 is an exploded view of an electronic apparatus according to another embodiment of the application. FIG. 8 is a front view of an assembled electronic apparatus of FIG. 7. FIG. 9 is an enlarged cross-sectional view of the electronic apparatus along the line II-II of FIG. 8. Referring to FIGS. 7-9, the assembly structure is similar to the structure shown in FIG. 1. Generally, the second circuit board 122 like the battery 130 is disposed in the accommodating space and disposed under the display module 140, in which the second circuit board 122 is actually disposed on the frame 150 as an example. Basically, the second circuit board 122 is not higher than the battery module 130, so that the second circuit board 122 can be well disposed in the accommodating space without changing the shape of the housing 110. The second circuit board 122 is beside the battery module 130 on the frame 150 as a general example.

In the embodiment of FIGS. 7-9, the width of the first circuit board 120 is narrower than the width of the second circuit board 122. The first circuit board 120 and the second circuit board 122 is fixed on the frame 150. The first circuit board 120 is stacked upon the battery module 130 and the second circuit board 122. The first circuit board 120 and the second circuit board 122 is fixed on the frame 150 via a fastener 123 (such as a screw) passing through a first through hole 120a of the first circuit board 120, a second through hole 122b of the second circuit board 122 and the frame 150.

The electronic apparatus 100 includes a vibrator 124 and a camera module 126. The second circuit board 122 has an opening 122a (e.g. a recess or a slot) distant from a longitudinal periphery of the housing 110 by a distance. The vibrator 124 and the camera module 126 are thicker than the second circuit 122 so that the vibrator 124 and the camera module 126 can be disposed in the opening 122a and located at the middle region relative to a longitudinal center line of the display module 140. In other word, the vibrator 124 and the camera module 126 distances from a longitudinal periphery of the housing 110 by a distance, so as to fit the smooth curving shape of the housing 110. The frame 150 also has an opening 150a (e.g. a recess or a slot) to hold the vibrator 124 or the camera module 126 disposed in the recess 122a.

In the embodiment of FIGS. 7-9, the electronic apparatus 100 further includes a third circuit board 128 and a speaker module 190. The third circuit board 128 is disposed in the opposite side of the second circuit board 122 beside the battery module 130. The speaker module 190 is disposed in the housing 110 and adjacent to the third circuit board 128. The first circuit board 120 and the third circuit board 128 is also fixed on the frame 150 via a fastener 129 (such as a screw) passing through a first through hole 120b of the first circuit board 120, a third through hole 128a of the third circuit board 128 and the frame 150.

Figure 10:
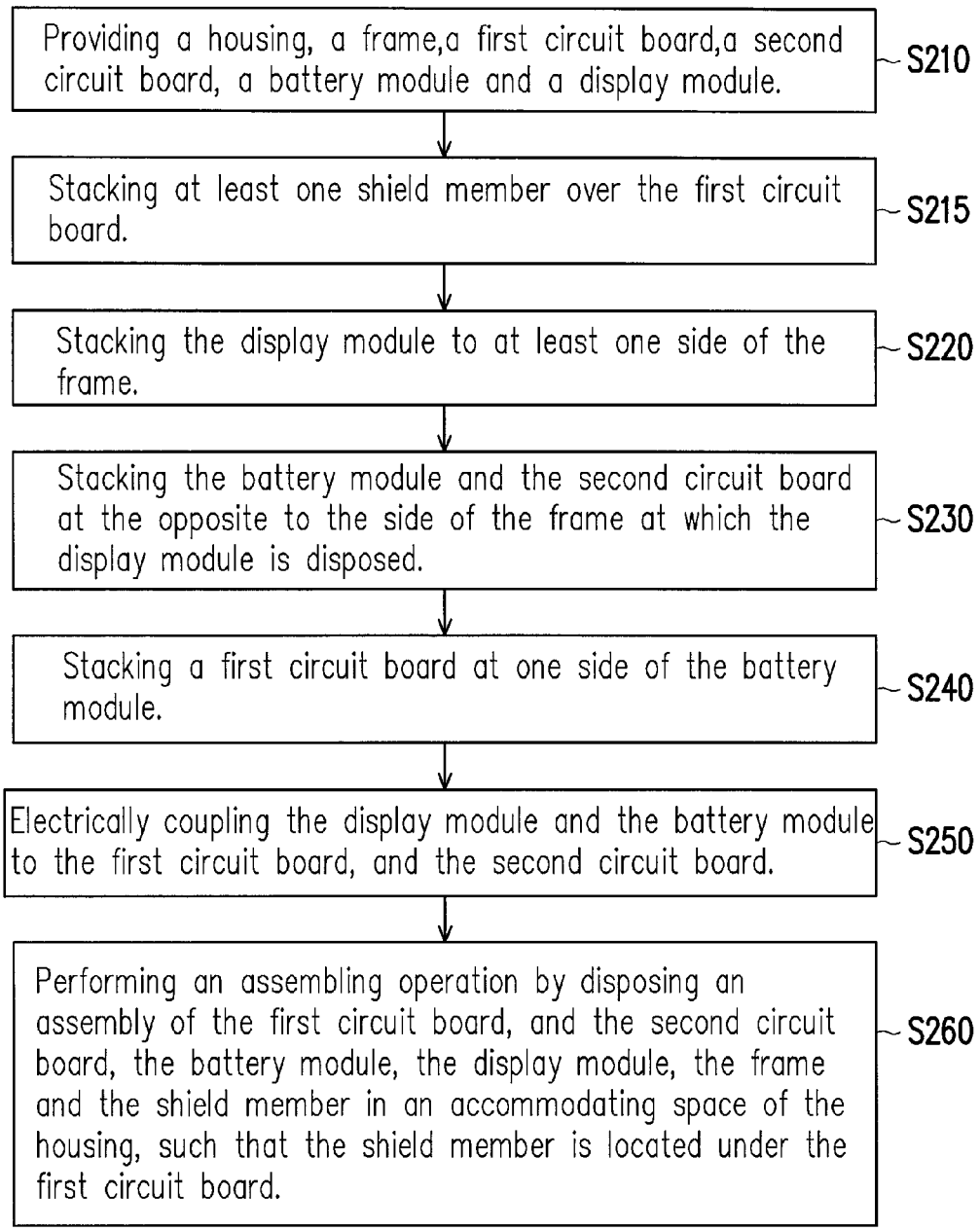
FIG. 10 is a flow chart of a method for assembling an electronic apparatus according to an embodiment of the application.

FIG. 10 is a flow chart of a method for assembling an electronic apparatus according to an embodiment of the application. Referring to FIGS. 7-9. In Step S210, the housing 110, the first circuit board 120 as the first circuit board, the second circuit board 122, the battery module 130, the display module 140 and the frame 150 are provided, wherein the housing 110 has the opening 112 and the accommodating space 114, the width of the first circuit board 120 is narrower than the width of the battery module 130, and the width of battery module 130 is narrower than the width of the display module 140. In Step S220, the display module 140 is stacked at one side of the frame 150.

In Step S230, the battery module 130 and the second circuit board 122 are stacked at the opposite side of the frame 150 at which the display module 140 is disposed. In Step S240, the first circuit board 120 is stacked at one side of the battery module 130. In Step S250, the display module 140 and the battery module 130 are electrically coupled to the first circuit board 120 and the second circuit board. In Step S260, an assembling operation is performed, wherein an assembly of the first circuit board 120, the second circuit board 122, the battery module 130, the display module 140 and the frame 150 are disposed in the accommodating space 114 of the housing 110.

Referring to FIG. 9 and FIG. 10. The present embodiment further includes Step S215. In Step S215, before performing the assembling operation (Step S260), the shield member 170 is located under the first circuit board 120, wherein the width of the shield member 170 is narrower than the width of the first circuit board 120. After the assembling operation (Step S260) is performed, the shield member 170 is also disposed in the accommodating space 114 and located under the first circuit board 120.

Referring to FIG. 9 and FIG. 10. In the present embodiment, a step of electrically coupling the display module 140 to the first circuit board 120 in Step S250 includes having the flexible printed circuit board 160 bypassing the battery module 130 and connecting the display module 140 and the first circuit board 120.

As disclosed in the application, the second circuit board 122 is located beside the battery module 130, stacking over the display module 140 or on the frame 150. The second circuit board 122 can carry the vibrator 124 at the middle region.

In light of the foregoing, the application presents an appearance of an electronic apparatus as a smooth arc shape, and a stacking method inside a space of the electronic apparatus allows interior components to be disposed in a housing with a design of a curved surface or an inclined plane. Accordingly, the application can effectively utilize an interior space of a housing to increase a capacity of a battery module.

In addition, the second circuit board is beside the battery module over the display module, so the second circuit can carry the vibrator at the middle region without modifying the shape of the housing.

Although the application has been described with reference to the above embodiments, it is not intended to limit the application. It will be apparent to people of ordinary skill in the art that modifications and variations to the described embodiments may be made without departing from the spirit and scope of the application. Accordingly, the scope of the application will be defined by the attached claims not by the above detailed descriptions.

What is claimed is:

1. An electronic apparatus, comprising:
   a housing having at least an opening and an accommodating space;
   a first circuit board disposed in the accommodating space;
   a battery module disposed in the accommodating space and stacked over the first circuit board;
   a display module disposed in the accommodating space and stacked over the battery module, wherein the display module is visible through the opening;
   a second circuit board disposed in the accommodating space and disposed under the display module, beside the battery module; and
   an electronic component, wherein the second circuit board has an opening distant from a longitudinal periphery of the housing by a distance, the electronic component is disposed in the opening, and the electronic component is substantially thicker than the second circuit board.

2. The electronic apparatus of claim 1, wherein the electronic component is a vibrator.

3. The electronic apparatus of claim 1, wherein the electronic component is a camera module.

4. The electronic apparatus of claim 1, further comprising:
   a third circuit board disposed in the opposite side of the second circuit board beside the battery module.

5. The electronic apparatus of claim 4, further comprising:
   a speaker module disposed in the housing and adjacent to the third circuit board.

6. The electronic apparatus of claim 1, wherein the width of the first circuit board is narrower than the width of the second circuit board.

7. The electronic apparatus of claim 1, wherein the battery module is located between the first circuit board and the display module, and at least one edge of the battery module in a width direction of the battery module is closer to a corresponding side of the housing than a corresponding edge of the first circuit board in a width direction of the first circuit board.

8. The electronic apparatus of claim 1, wherein a part of the housing extends along a curved surface or an inclined plane.

9. The electronic apparatus of claim 1, wherein the edge of the first circuit board, the edge of the second circuit board and the edge of the battery module lean against the part of the housing.

10. The electronic apparatus of claim 1, further comprising:
    a frame disposed in the accommodating space to secure a relative position between the battery module and the display module.

11. The electronic apparatus of claim 10, wherein the first circuit board and the second circuit board is fixed on the frame.

12. The electronic apparatus of claim 11, wherein the first circuit board is stacked upon the battery module and the second circuit board, and the first circuit board and the second circuit board is fixed on the frame via a fastener passing through a first through hole of the first circuit board, a second through hole of the second circuit board and the frame.

13. The electronic apparatus of claim 10, the frame further comprising an opening to hold a vibrator or a camera module disposed in the recess.

14. The electronic apparatus of claim 1, further comprising:
    a flexible printed circuit board connecting the first circuit board and the display module.

15. The electronic apparatus of claim 14, wherein the flexible printed circuit board bypasses the battery module and connects the first circuit board and the display module.

16. The electronic apparatus of claim 1, further comprising:

at least one shield member disposed in the accommodating space and located under the first circuit board, wherein a width of the shield member is narrower than the width of the first circuit board.

17. The electronic apparatus of claim 1, further comprising:
a cover plate disposed at the opening, wherein the display module is located between the battery module and the cover plate.

18. An electronic apparatus, comprising:
a housing having at least an opening and an accommodating space;
a first circuit board disposed in the accommodating space;
a battery module disposed in the accommodating space and stacked over the first circuit board;
a display module disposed in the accommodating space and stacked over the battery module, wherein the display module is visible through the opening;
a second circuit board disposed in the accommodating space and disposed under the display module, beside the battery module; and
a frame disposed in the accommodating space to secure a relative position between the battery module and the display module,
wherein the first circuit board and the second circuit board are fixed on the frame and the first circuit board is stacked upon the battery module and the second circuit board, and the first circuit board and the second circuit board is fixed on the frame via a fastener passing through a first through hole of the first circuit board, a second through hole of the second circuit board and the frame.

19. An electronic apparatus, comprising:
a housing having at least an opening and an accommodating space;
a first circuit board disposed in the accommodating space;
a battery module disposed in the accommodating space and stacked over the first circuit board;
a display module disposed in the accommodating space and stacked over the battery module, wherein the display module is visible through the opening;
a second circuit board disposed in the accommodating space and disposed under the display module, beside the battery module; and
at least one shield member disposed in the accommodating space and located under the first circuit board, wherein a width of the shield member is narrower than the width of the first circuit board.

* * * * *